United States Patent
Bezama et al.

(10) Patent No.: US 8,674,506 B2
(45) Date of Patent: Mar. 18, 2014

(54) STRUCTURES AND METHODS TO REDUCE MAXIMUM CURRENT DENSITY IN A SOLDER BALL

(71) Applicant: International Business Machines Corporation, Armonk, NY (US)

(72) Inventors: Raschid J. Bezama, Mahopac, NY (US); Timothy H. Daubenspeck, Colchester, VT (US); Gary LaFontant, Elmont, NY (US); Ian D. Melville, Highland, NY (US); Ekta Misra, Fishkill, NY (US); George J. Scott, Wappingers Falls, NY (US); Krystyna W. Semkow, Poughquag, NY (US); Timothy D. Sullivan, Underhill, VT (US); Robin A. Susko, Owego, NY (US); Thomas A. Wassick, LaGrangeville, NY (US); Xiaojin Wei, Poughkeepsie, NY (US); Steven L. Wright, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/873,801

(22) Filed: Apr. 30, 2013

(65) Prior Publication Data

US 2013/0234329 A1   Sep. 12, 2013

Related U.S. Application Data

(62) Division of application No. 12/640,752, filed on Dec. 17, 2009, now Pat. No. 8,446,006.

(51) Int. Cl.
*H01L 23/498*  (2006.01)

(52) U.S. Cl.
USPC ...... 257/738; 257/737; 257/773; 257/E23.02; 257/E23.021

(58) Field of Classification Search
USPC ............. 257/737, 738, 773, E23.02, E23.021
See application file for complete search history.

(56) References Cited

U.S. PATENT DOCUMENTS

| | | | |
|---|---|---|---|
| 6,133,136 A | 10/2000 | Edelstein et al. | |
| 6,298,551 B1 * | 10/2001 | Wojnarowski et al. | 29/829 |
| 6,365,956 B1 | 4/2002 | Nonaka | |
| 6,522,021 B2 | 2/2003 | Sakihama et al. | |
| 6,596,624 B1 | 7/2003 | Romankiw | |
| 6,822,327 B1 | 11/2004 | Mithal et al. | |

(Continued)

FOREIGN PATENT DOCUMENTS

| | | |
|---|---|---|
| JP | 2002016065 | 1/2002 |
| WO | 2007064073 | 6/2007 |

OTHER PUBLICATIONS

"Mini-Cu Vias for 3D Connections" IBM Technical Disclosure IPCOM000182403D, Anonymous, Apr. 29, 2009, pp. 1-4.

*Primary Examiner* — Peniel M Gumedzoe
(74) *Attorney, Agent, or Firm* — David Cain; Roberts Mlotkowski Safran & Cole, P.C.

(57) ABSTRACT

Structures and methods to reduce maximum current density in a solder ball are disclosed. A method includes forming a contact pad in a last wiring level and forming a plurality of wires of the contact pad extending from side edges of the contact pad to respective ones of a plurality of vias. Each one of the plurality of wires has substantially the same electrical resistance.

13 Claims, 16 Drawing Sheets

(56) References Cited

U.S. PATENT DOCUMENTS

| | | |
|---|---|---|
| 7,081,679 B2 | 7/2006 | Huang et al. |
| 7,208,402 B2 | 4/2007 | Bohr et al. |
| 7,208,843 B2 | 4/2007 | Richling et al. |
| 7,328,830 B2 | 2/2008 | Bachman et al. |
| 7,411,306 B2 | 8/2008 | Leu et al. |
| 7,541,272 B2 | 6/2009 | Daubenspeck et al. |
| 2002/0000668 A1 | 1/2002 | Sakihama et al. |
| 2002/0077798 A1 | 6/2002 | Inoue et al. |
| 2006/0012039 A1 | 1/2006 | Kim et al. |
| 2006/0249848 A1 | 11/2006 | Coolbaugh et al. |
| 2007/0001301 A1 | 1/2007 | Wang |
| 2008/0042271 A1 | 2/2008 | Dauksher et al. |
| 2008/0249727 A1 | 10/2008 | Takase |

\* cited by examiner

STRUCTURES AND METHODS TO REDUCE MAXIMUM CURRENT DENSITY IN A SOLDER BALL

FIELD OF THE INVENTION

The invention generally relates to semiconductor devices, and more particularly to structures and methods for enhancing electromigration (EM) performance in solder bumps and related structures.

BACKGROUND

Integrated circuits conventionally comprise a substrate, semiconductor devices, and wiring (e.g., metallization) layers formed above the semiconductor devices. The wiring layers comprise various interconnects that provide electrical connections between the devices and external connections. Solder projections (also referred to as solder bumps, bumps, or solder balls) are commonly utilized to provide a connection between the last (e.g., top) wiring level of a semiconductor device and another device. A common type of solder bump is the controlled collapse chip connection (C4) solder bump.

Current generation chip products make use of an aluminum last-metal (LM) pad which connects to a C4 solder bump. There are two primary variations on this structure. On the one hand, in structures used specifically for base silicon-on-insulator (SOI) technologies, the aluminum level comprises only a pad (i.e., no wires or other structures), the pad making a connection directly down through a large, centrally located via opening to the last metal wiring level (e.g., wire, interconnect, etc.). On the other hand, in conventional structures used for foundry and application specific integrated circuit (ASIC) technologies, the aluminum level comprises a combination pad and aluminum last-metal wiring level. The pad in the latter case makes contact to the last metal wiring level through multiple small vias, which are offset in location with respect to the pad center (e.g., by about 10 μm). However, in both instances, the pad contacts the ball limiting metallization (BLM) layer (also known as the under bump metallization, i.e., UBM) in a single large contact area.

As dimensions of features (e.g., pads, wires, interconnects, vias, etc.) continue to shrink to create smaller devices, the maximum allowable current density decreases rapidly due to electromigration (EM) effects. Electromigration is a well known phenomenon in which, generally speaking, atoms of a metal feature are displaced due to the electrical current passing through the feature. The migration of atoms can result in voids in the feature, which can increase electrical resistance or cause failure of the feature, both of which negatively impact reliability of the integrated circuit. For example, in C4 solder bump contact arrangements, electromigration damage typically originates at a location of highest current density and then progresses across the interface between the solder bump and the BLM until the connection is broken.

For conventional technologies, C4 solder bump electromigration performance is approaching a performance limit, especially as the technologies migrate to lead-free C4 solder structures that are more susceptible to electromigration. In conventional C4 solder bump contact designs, the electrical current pools (e.g., becomes crowded), which results in a localized increase in current density. For example, in the known pad arrangements discussed above, current tends to pool at a small area of the leading edge of the connection between the wire, pad, BLM, and solder bump. Particularly, in many applications, nearly all of the current flows through a narrow region at the leading edge of the via, and very little current flows through the remainder of the via. This crowding of current associated with C4 pad and/or via structures often results in electromigration void formation, which can lead to increased resistance and ultimately failure of the device.

Accordingly, there exists a need in the art to overcome the deficiencies and limitations described hereinabove.

SUMMARY

In a first aspect of the invention, there is a method of forming a semiconductor device. The method includes forming a contact pad in a last wiring level and forming a plurality of wires of the contact pad extending from side edges of the contact pad to respective ones of a plurality of vias. Each one of the plurality of wires has substantially the same electrical resistance.

In another aspect of the invention, there is a method of forming a semiconductor device. The method includes forming a solder bump contact pad in a last wiring level of a chip and forming at least one wire in the last wiring level, wherein the at least one wire contacts the contact pad. The method also includes forming a dielectric capping layer on the last wiring level, the contact pad, and the at least one wire, and forming an opening in the dielectric capping layer, wherein the opening exposes a portion of an upper surface of the contact pad and defines at least one block. The at least one block comprises residual material of the dielectric capping layer on a portion of the contact pad surrounding a location where the at least one wire contacts the contact pad.

In another aspect of the invention, there is a method for forming a semiconductor device. The method includes forming a capping layer on a solder bump contact pad that is arranged in a last wiring level of a chip, and forming a passivation layer on the capping layer. The method also includes forming a terminal via in the capping layer, wherein the terminal via contacts the contact pad, and forming a final via in the passivation layer, wherein the final via is in electrical contact with the terminal via. The method also includes making upper surfaces of the final via and the passivation layer co-planar, forming a ball limiting metallurgy (BLM) layer on the co-planar upper surfaces of the final via and the passivation layer, and forming a solder bump on the BLM layer.

In another aspect of the invention, there is a method of forming a semiconductor device. The method includes forming at least one terminal via in a capping layer, and planarizing upper surfaces of the at least one terminal via and the capping layer. The method also includes forming a passivation layer on the planarized upper surfaces of the at least one terminal via and capping layer, and forming at least one final via in the passivaiton layer. The method further includes forming a ball limiting metallurgy (BLM) layer on upper surfaces of the at least one final via and the passivation layer, and forming a solder bump on the BLM layer.

In another aspect of the invention, there is a semiconductor structure including a contact pad in a last wiring level of a chip and a plurality of wires of the contact pad extending from side edges of the contact pad to respective ones of a plurality of vias. Each one of the plurality of wires has substantially the same electrical resistance. A first one of the plurality of wires has a first length and a first width. A second one of the plurality of wires has a second length and a second width. The first width is different from the second width and the first length is different from the second length.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to semiconductor devices, and more particularly to structures and methods for enhancing electromigration (EM) performance in solder bumps and related structures. In embodiments, a contact pad in a last wiring level is configured to distribute current among plural same-resistance wires leading into plural vias under a solder bump. In additional embodiments, current in a contact pad is diverted using one or more blocks of insulating material that cause the current to spread out within the contact pad. In further embodiments, conductive structures between the contact pad and the solder bump are configured to spread current using configurations of copper structures, by planarizing levels, and by eliminating the conventional aluminum pad. In this manner, implementations of the invention provide improved EM resistance by reducing current density in solder bump contact arrangements.

Figure 1:
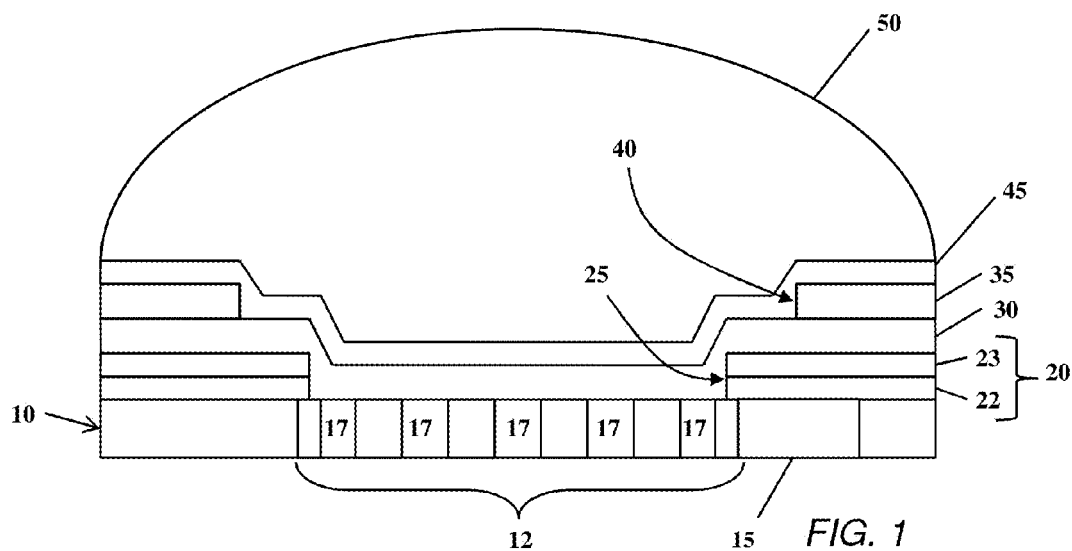
FIGS. 1 and 2 show solder bump contact arrangements.

FIG. 1 shows a cross sectional view of an exemplary semiconductor structure in which layer 10 is an upper level (e.g., last level, last metal, LM, etc.) wiring layer of an integrated circuit chip. Layer 10 is formed atop one or more additional wiring levels of the chip (not shown) and may be composed of, for example, dielectric material, e.g., doped silicon carbide, silicon nitride, low-k materials, TEOS, FTEOS, etc. A contact pad 12 is disposed in the layer 10 and is electrically connected to one or more wires 15 also disposed in the layer 10, the wires 15 representing back end of line (BEOL) wiring of the chip. The contact pad 12 is formed around discrete posts 17 of the material of the layer 10, such that the contact pad 12 is perforated (or 'cheesed'), as is known such that further explanation is not believed necessary for a complete understanding of the invention.

The contact pad 12 and wires 15 may be composed of any suitable conducting material, including, but not limited to: copper, copper alloy, aluminum, etc. The contact pad 12 and wires 15 may be formed in the layer 10 using conventional semiconductor processing techniques, such as, for example, masking and etching the layer 10 in a prescribed pattern, e.g., using photolithography and reactive ion etch (RIE), and depositing conductive material in the etched portions of the layer 10, e.g., using chemical vapor deposition (CVD), plasma enhanced chemical vapor deposition (PECVD), atomic layer deposition (ALD), etc.

Formed over the layer 10 is capping layer 20 of hard dielectric. The capping layer 20 comprises two films 22 and 23, the lower film 22 being composed of an oxide based material, and the upper film 23 being composed of a nitride based material. The capping layer comprises a terminal via (TV) opening 25 centered over the contact pad 12. A conductive pad 30, which is commonly composed of aluminum, is formed on the capping layer 20 and on the layer 10 and contact pad 12 in the terminal via opening 25. A passivation layer 35 having a final via (FV) opening 40 is formed over the pad 30. The passivation layer 35 comprises, for example, photosensitive polyimide (PSPI).

Still referring to FIG. 1, the semiconductor structure further includes a ball limiting metallization (BLM) layer 45 and a solder bump 50. The BLM layer 45 is arranged along exposed portions of a final via opening 40 formed in the passivation layer 35. The pad 30 may be composed of aluminum, the BLM 45 may be composed of at least one of tungsten, copper, and nickel, and the solder bump 50 may comprise a conventional lead free composition (e.g., tin, copper, etc.). The contact pad 12, aluminum pad 30, and BLM layer 45 provide a conductive path between the wires 15 and the solder bump 50.

Figure 2:
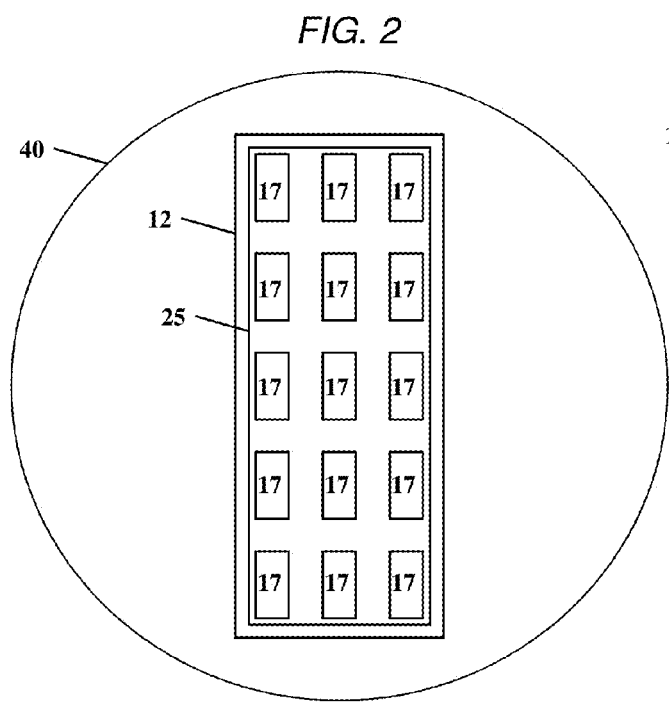

FIG. 2 shows a plan view of the contact pad 12 and the posts 17, the contact pad 12 being substantially centered relative to the terminal via opening 25 and the final via opening 40. For advanced technology nodes, the contact pad 12 may be substantially rectangular with a width of about 46.4 µm and a height of about 18.4 µm. The posts 17, which are useful for preventing dishing of the contact pad 12 during chemical mechanical polishing (CMP) are also substantially rectangular, having a width of about 6.16 µm and a height of about 2.92 µm. Also for the 45 nm technology node, the terminal via opening 25 is substantially rectangular having a width of about 44 µm and a height of about 16 µm, and the final via opening 40 is substantially circular having a diameter of about 58 µm.

Figure 3:
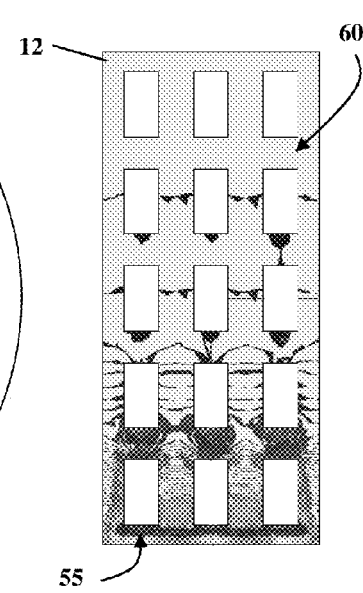
FIG. 3 shows a map of current density in a contact pad.

FIG. 3 shows a plot of current density (e.g., a current density map) in the contact pad 12. Area 55 depicts a relatively high current density at the leading edge of the contact pad 12 where the current initially enters the contact pad 12, whereas area 60 depicts a relatively low current density at other portions of the contact pad 12. The high current density at the leading edge of the contact pad 12 can result in an origination of electromigration damage, which can ultimately lead to failure of the chip. Moreover, the formation of the relatively large final via opening 40, described above, can produce undesired mechanical stress in the BEOL layers of the chip beneath the solder bump.

Figure 4:
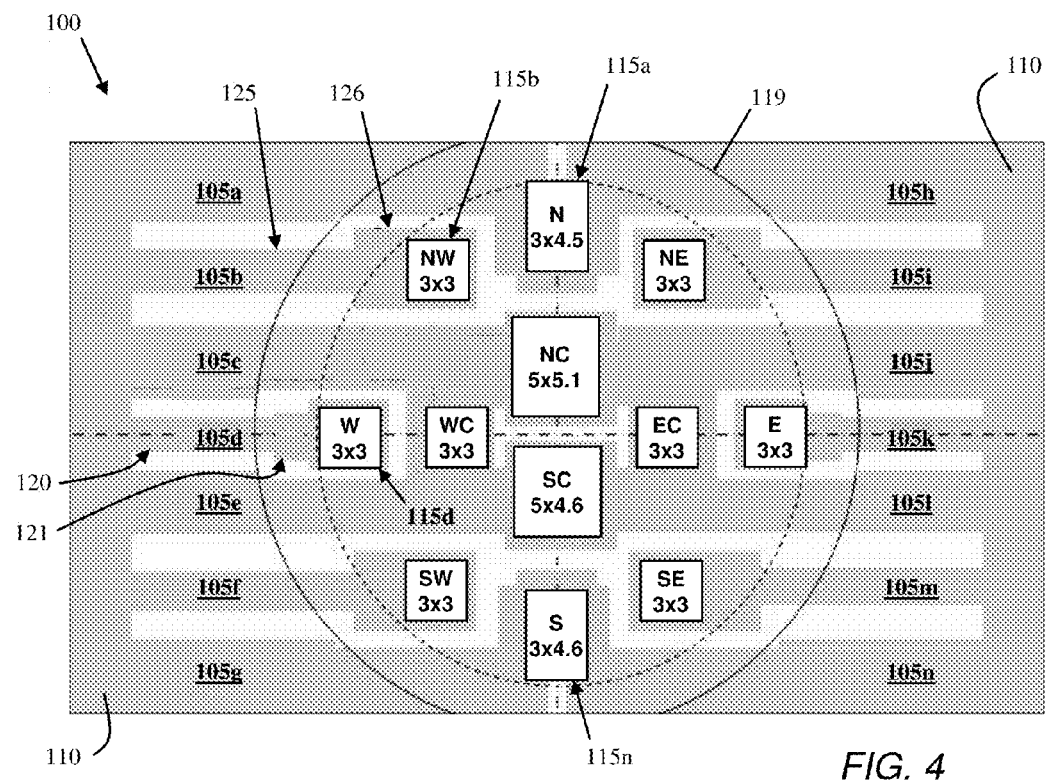

FIG. 4 shows a contact pad 100 in accordance with aspects of the invention. In embodiments, the contact pad 100 is disposed in a last metal layer (e.g., similar to layer 10 of FIG. 1) and is divided into several discrete wires 105a, 105b, . . . , 105n. Each wire is connected between an edge 110 of the contact pad 100 and one of a plurality of vias 115a, 115b, . . . , 115n that extend from the last metal layer to a next layer above. The dimensions of the respective wires 105a, 105b, . . . , 105n are selected such that each wire provides substantially the same resistance between an edge 110 of the contact pad 100 and the respective vias 115a, 115b, . . . , 115n, such that the current to each of the vias 115a, 115b, . . . , 115n is the same. By diverting the current amongst plural wires and vias, the current is divided up and forced to flow through separate locations within a final via opening 119 (which may be similar to final via opening 40 described in FIG. 1). In this manner, a magnitude of the peak current density is reduced relative to that for arrangements that utilize a single large via (e.g., such as that described with respect to FIGS. 1-3).

In embodiments, the width and length of each one of the wires 105a, 105b, ..., 105n are adjusted to produce the same electrical resistance between the edges 110 of the contact pad 100 to the individual vias 115a, 115b, ..., 115n. More specifically, by forming each of the wires 105a, 105b, ..., 105n with a common thickness (e.g., the depth of the last metal layer) and of a same material (e.g., having the same resistivity), the resistance for a particular wire may be selectively adjusted based on the length and width of the wire. Particularly, when thickness and resistivity are common amongst the wires, a relative measure of the resistance of each wire may be approximated by the ratio of length to width of a wire.

Figure 5:
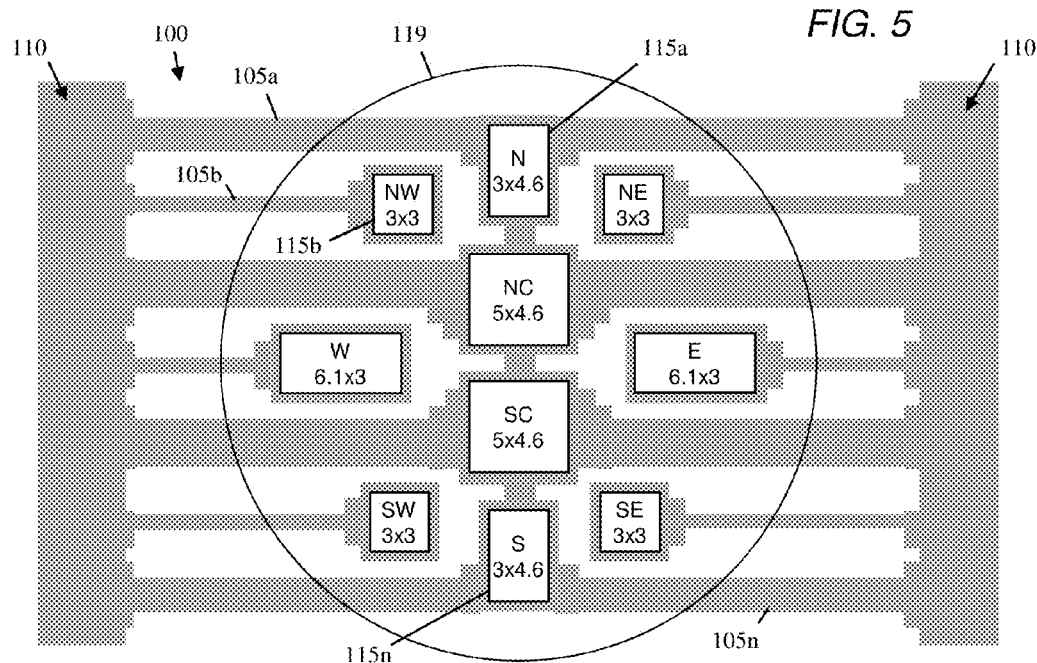
FIGS. 4 and 5 show solder bump contact configurations according to aspects of the invention.

As an illustrative non-limiting example, wire 105d may be composed of two segments 120 and 121. Segment 120 may have a length of about 7 µm and a width of about 1.2 µm, and segment 121 may have a length of about 1.5 µm and a width of about 2.4 µm. A relative measure of the resistance of the wire 105d is given by the sum of (7 µm/1.2 µm) and (1.5 µm/2.4 µm), which equals about 6.5 squares of metal. Similarly, wire 105b may be composed of two segments 125 and 126. Segment 125 may have a length of about 13 µm and a width of about 2.18, and segment 126 may have a length of about 2 µm and a width of about 4 µm. The relative measure of the resistance of the wire 105b is given by the sum of (13 µm/2.18 µm) and (2 µm/4 µm), which equals about 6.5 squares of metal. Thus, although wires 105d and 105b have different shapes, the wires 105a and 105b have substantially the same resistance and therefore deliver the same amount of current to their respective vias 115d and 115b. It is noted that the dimensions described herein are merely exemplary and are not intended to limit the invention. Instead, any number of wires having any desired geometry may be used within the scope of the invention, provided that the wires have substantially the same resistance, as described herein. For example, FIG. 5 depicts another exemplary layout of wires 105a-n and vias 115a-n in accordance with aspects of the invention.

In embodiments, each wire 105a, 105b, ..., 105n increases in width (e.g., the wire diverges) immediately in front of the one of the vias 115a, 115b, ..., 115n to which it is connected. This allows current spreading in order to produce a more uniform current distribution along the leading edge of the via. In particular embodiments, each wire (e.g., 105d) has a maximum width within one via width from a leading edge of the via (e.g., 115d) to allow for current fan-out (e.g., divergence) to the leading edge of the via.

In accordance with aspects of the invention, the size and location of each respective via 115a-n may be selected according to a desired configuration for the solder bump contact arrangement. Although particular via sizes are shown in FIGS. 4 and 5 (e.g., via 115d in FIG. 4 has a footprint of 3 µm by 3 µm), the invention is not limited to vias of any particular size. Instead, any desired size vias may be used within the scope of the invention. The contact pad 100 including wires 105a-n and vias 115a-n may be formed in a layer using conventional semiconductor processing techniques, such as, for example, masking and etching the layer in a prescribed pattern, e.g., using photolithography and reactive ion etch (RIE), and depositing conductive material in the etched portions of the layer, e.g., using CVD, PECVD, ALD, etc.

In embodiments, the layout of a contact pad 100 may be configured to be in conformance with design rules, such as, for example, minimum wire width (e.g., 0.8 µm), minimum spacing between wires (e.g., 0.8 µm), minimum via size (e.g., 3 µm by 3 µm), and maximum amount of metal density in a given area (e.g., 75%), etc. For example, a layout of a contact pad 100 including the number of a wires and vias, and relative sizes and spatial distribution of the wires and vias, may be determined (e.g., using numerical optimization techniques) to maximize the number of wires and vias (e.g., for dividing the current) while satisfying the constraint of each wire having substantially the same electrical resistance and while also satisfying any applicable design rules for the manufacturing technology. Although particular examples of design rules have been described herein, the invention is not limited to these design rules; rather, any suitable design rules may be used within the scope of the invention.

Figure 6:
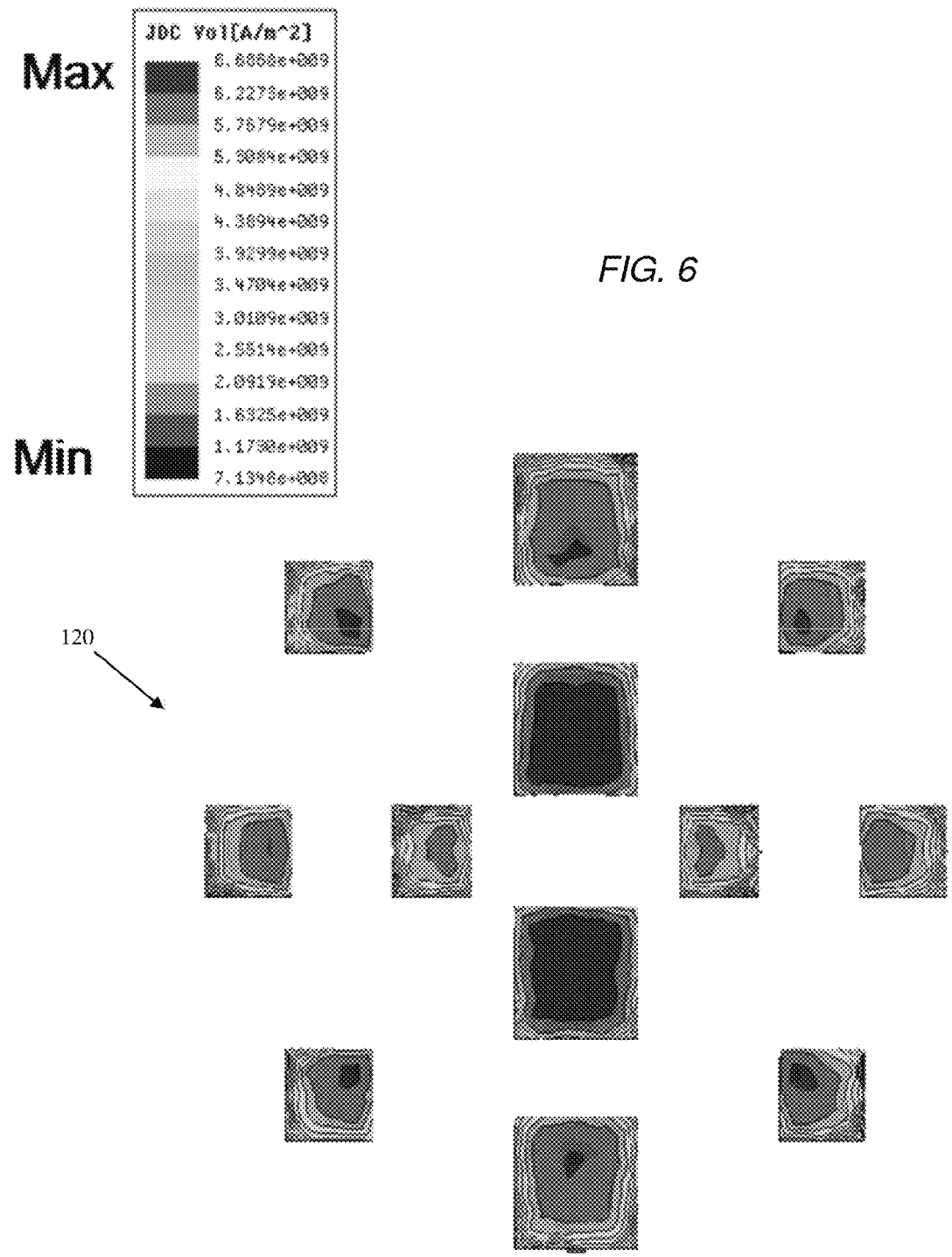
FIG. 6 shows a map of current density in a contact pad according to aspects of the invention.

FIG. 6 shows a current density map 120 within the several vias 115a-n from the contact pad 100 depicted in FIG. 4. When compared to the current density map of the contact pad 12 shown in FIG. 3, it can be seen that the contact pad 100 made in accordance with aspects of the invention spreads the current to more locations within an final via and solder bump. In this manner, implementations of the invention reduce the effects of EM damage in the solder bump contact arrangement.

However, even with plural wires and vias, as described in accordance with aspects of the invention, the current flows through less than half the footprint of each respective via, meaning that the current pools (e.g., crowds) at the leading edge of each respective via. Accordingly, in embodiments, the width of each respective via (e.g., measured perpendicular to the leading edge of the via) may be minimized to the design rule minimum. For example, a layout of a contact pad including the number of a wires and vias, and relative sizes and spatial distribution of the wires and vias, may be determined to maximize the number of wires and vias while satisfying the following constraints: each wire having substantially the same electrical resistance; minimizing the width of each respective via; and, satisfying any applicable design rules for the manufacturing technology.

In embodiments, by using plural vias and wires having substantially the same resistance, any EM damage that occurs at a particular via is confined to that via and does not propagate to affect another via. For example, if EM damage begins at a particular via and eventually destroys the connection between that via and the BLM, the damage is confined to that particular via while the other vias remain unaffected by the damage and continue carrying current.

By providing a contact pad with plural wires and vias, where each wire has substantially the same resistance, implementations of the invention cause the current arriving at an edge of the contact pad to be distributed amongst plural locations in the final via and solder bump. This reduces the amount of near-zero current density areas (e.g., area 60 shown in FIG. 3), which allows the contact pad 100 made in accordance with aspects of the invention to be smaller than contact pad 12 shown in FIGS. 1-3. As such, by using plural distributed vias and same resistance wires in accordance with aspects of the invention, the FV opening diameter may be reduced, which reduces stress on the underlying layers of the chip. In a particular non-limiting example, the FV opening diameter used with a contact pad 100 in accordance with aspects of the invention is about 30 µm, while the FV opening diameter used with a conventional contact pad that carries about the same amount of current is about 47 µm. Thus, implementations of the invention reduce current density by better distributing the current within the FV and solder bump, and also provide for a smaller FV opening diameter which reduces undesired stress in underlying layers of the chip.

In embodiments, a contact pad in accordance with aspects of the invention comprises a last-metal (LM) layer connection structure formed having an overall footprint (e.g., overall length by width) similar to or smaller than a conventional last-metal copper pad structure on an IC chip. The contact pad provides current distribution between the LM layer on the IC chip and a connecting solder bump, and is configured to direct the current into a circular central area of the solder bump connection through multiple individual via connections between the LM layer and the solder bump. The contact pad and the vias are positioned to provide a relatively uniform current distribution within the central area of the solder bump. The contact pad and each via in a dielectric layer overlying the LM layer define where the current enters the bottom of the solder bump and limits the extent of EM damage at that location (e.g., limits EM damage associated with that via to that via). Additionally, the wires in the LM layer that connect to the contact pad may be constrained to the width of the contact pad and connect only at the opposite ends of the contact pad without looping out to contact the sides of the contact pad.

In embodiments, the contact pad has multiple internal wires of different and varying widths and lengths connected to respective vias. The width and length of each wire may be tailored to provide similar resistance values between the edge of the pad and a respective via within a central portion of the contact pad. Moreover, a wire may have more than one width along its length, and the wire may have a maximum width within one via width in front of the edge of the via (e.g., to allow current fanout to the leading edge of the via).

In accordance with additional aspects of the invention, a patterned insulator may be used to reduce current density by diverting and distributing current flowing from a contact pad to an upper level conductor pad. The patterned insulator may be used in addition to, or alternatively to, arranging the geometry of the contact pad as described above with respect to FIGS. 4-6.

FIGS. 7-13 show exemplary arrangements of wires, contact pads, and blocks (e.g., current blocking structures) in accordance with aspects of the invention. However, the invention is not limited to the exemplary geometries of the features (e.g., wires, contact pad, blocks, conductive layers, etc.) described with respect to FIGS. 7-13. Instead, a contact pad may have any desired shape within the scope of the invention, and any number of wires and blocks having any desired shapes may be used within the scope of the invention. By using implementations of the invention, such as those described with respect to FIGS. 7-13, the LM layer under the solder bump (e.g., solder ball) is designed to redirect the electron current vector at the target metal interface to a prescribed angle range while maximizing pinch volume length (where pinch volume represents a volume at the solder-barrier-LM interface where the distance between a point in the solder axis and a point in the current feed LM line is less than a given value). Accordingly, current vectors within the pinch volume point away from the solder axis and/or are parallel to each other, which is different from conventional arrangements in which current vectors point towards solder axis. In this manner, electrical connectivity between the LM layer and the solder is tailored to manipulate current vectors in the pinch volume, and wires in the LM layer with equal current density can be merged at a point of equal potential relative to a point in the solder axis.

As described herein, C4 electromigration (EM) capability is limited by current crowding in final pad/via designs. Known designs commonly employ a last metal (LM) layer copper wire that introduces current laterally below the UBM/C4 bump structure, and up into the UBM/BLM through a hard dielectric (e.g., capping layer) terminal via (TV) opening and above that through a top-level polyimide final via (FV) opening. There is typically a layer of aluminum (e.g., an aluminum pad) disposed between the hard dielectric and polyimide layers, the layer of aluminum serving as a pad support layer for the UBM/BLM/C4 structure. Current exiting the last metallization (LM) layer flows directly through the UBM/BLM into the solder bump. Due to the normally thin dimension of the last metal wiring (e.g., on the order of about 1 μm), the current enters the solder concentrated at the edge of either the terminal via or the final via. Thus, the current density is very high where the current enters the solder, and much lower elsewhere in other portions of the conductive material. The result of this non-uniform current distribution is that EM damage first occurs at the location of highest current density. Once the EM damage begins, voiding in the solder bump or the UBM follows shortly, and the location of the high current density moves to the edge of the void, widening the damage area.

Figure 7:
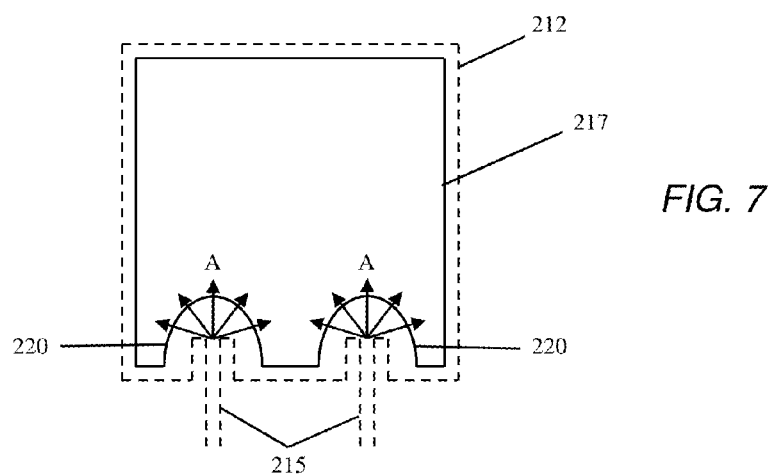
FIG. 7 shows a top-down view of a semiconductor structure in accordance with aspects of the invention.

FIG. 7 shows a top-down partial view of a solder bump contact arrangement in accordance with aspects of the invention. This arrangement includes a contact pad 212 and wires 215, both shown in dashed lines. A TV opening 217 is formed in a capping layer formed over the contact pad 212 and exposes a portion of the contact pad 212. The TV opening 217 is shaped such that a portion of the capping layer forms a block 220 over a portion of the contact pad 212, where the wire 215 connects to the contact pad 212. In embodiments, the wire 215 may be similar to wire 15 described with respect to FIG. 1, and the contact pad 212 may be similar to contact pad 12 described with respect to FIG. 1 and/or contact pad 100 described with respect to FIGS. 4 and 5.

In embodiments, the block 220 is formed from residual material of a capping layer (e.g., which may be similar to capping layer 20 of FIG. 1) that is patterned and left in place during formation of the TV opening 217 (e.g., which may be similar to TV opening 25 of FIG. 1). According to aspects of the invention, the block 220 is sized and located over a portion of the contact pad 212 where the wire 215 enters the contact pad 212. When viewed in plan view (e.g., top down view), the block 220 surrounds the location of the contact pad 212 where the wire 215 comes into contact with the contact pad 212. When the next conductive layer (e.g., pad 30 from FIG. 1) is formed over the contact pad 212 in the TV opening 217, the block 212 obstructs (e.g., prevents) direct contact between the next conductive layer and the contact pad in the area defined by the block 212. In this manner, current coming into the contact pad 212 through the wire 215 cannot turn immediately upward when it reaches the contact pad 212, but rather must travel through the contact pad 212 beyond the extent of the block 220 before moving upward to the next conductive layer. Accordingly, the block 220 re-directs (e.g., diverts) the incoming current, shown by arrows "A", into a larger area of the contact pad 212, which reduces current density and, therefore, minimizes EM effects.

Figure 8A:
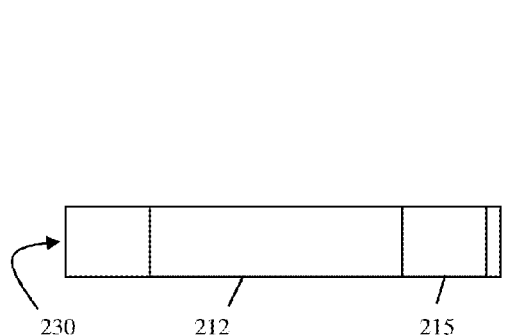
FIGS. 8A, 8B, 9A, 9B, 10A, and 10B show structures and respective processing steps in accordance with aspects of the invention.
Figure 8B:
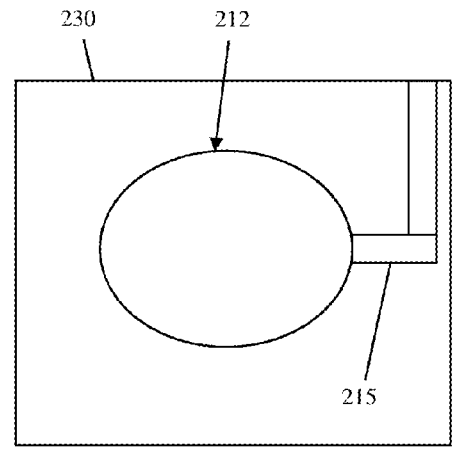
Figure 9A:
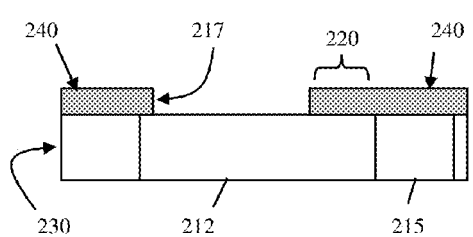
Figure 9B:
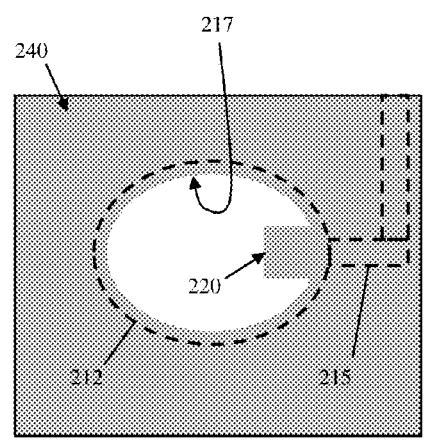
Figure 10A:
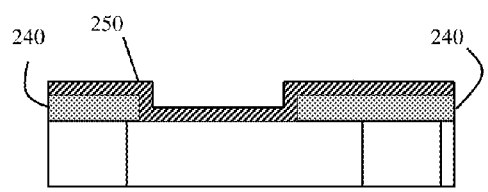
Figure 10B:
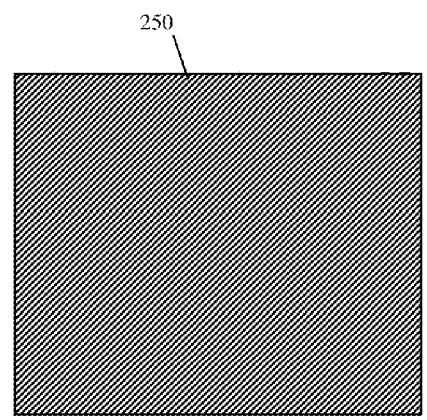

FIGS. 8A, 8B, 9A, 9B, 10A, and 10B depict structures and processing steps in accordance with aspects of the invention. FIGS. 8A, 9A, and 10A show side views of layered semiconductor structures, while FIGS. 8B, 9B, and 10B show corresponding top-down views of the respective structures. More specifically, FIGS. 8A and 8B show a last-metal (LM) layer 230, which may be similar to layer 10 described above with respect to FIG. 1. Arranged within the LM layer 230 are a contact pad 212 and a wire 215, which may be formed using conventional semiconductor processing techniques (e.g., photolithographic patterning, etching, and metal fill) and which may be composed of conventional materials (e.g., copper, aluminum, alloys, etc.). The contact pad 212 and a wire 215 may have any desired geometry within the scope of the invention.

As shown in FIGS. 9A and 9B, a capping layer 240 having a TV opening 217 and a block 220 are formed over the LM layer 230, contact pad 212 and wire 215. In embodiments, the capping layer 240 may be similar to capping layer 20 described with respect to FIG. 1, and may be formed by a blanket deposition of one or more layers of insulating material (e.g., by CVD, etc.) followed by selective removal of portions of the insulating material using conventional patterning and etching processes. The removal of portions of the capping layer 20 creates the TV opening 217. As seen in FIG. 9B, a first portion of the contact pad 212 is exposed through the TV opening 217; however, the block 220 remains in place over a second portion of the contact pad 212 such that the second portion of the contact pad 212 is not exposed.

FIGS. 10A and 10B show a conductive layer 250 formed over the a capping layer 240 and in the TV opening 217 on exposed portions of the contact pad 212. In embodiments, the conductive layer 250 may be similar to pad 30 described above with respect to FIG. 1 and may be formed using conventional techniques (e.g., CVD, etc.) and materials (e.g., aluminum). Although not shown, the semiconductor structure may be further processed using conventional techniques, including forming a passivation layer, forming an FV opening in the passivation layer, forming a BLM or UBM layer in the FV opening and on exposed portions of the conductive layer 250, and forming a solder bump on the BLM or UBM layer.

Figure 11:
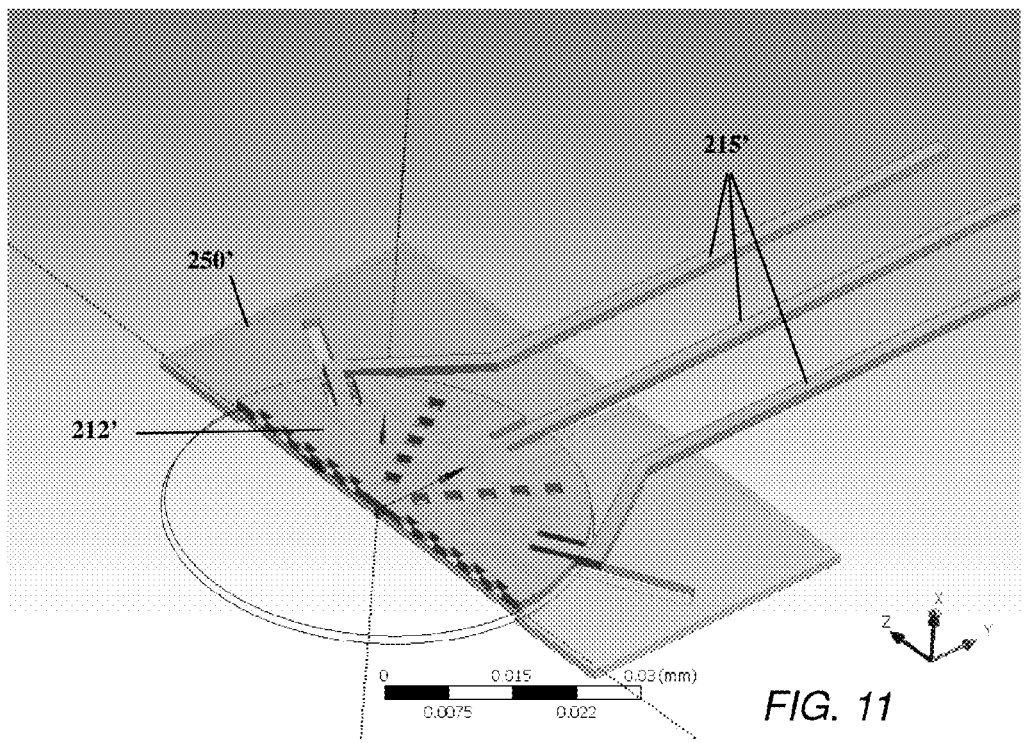
FIGS. 11-13 show partial perspective views of semiconductor structures in accordance with aspects of the invention.
Figure 12:
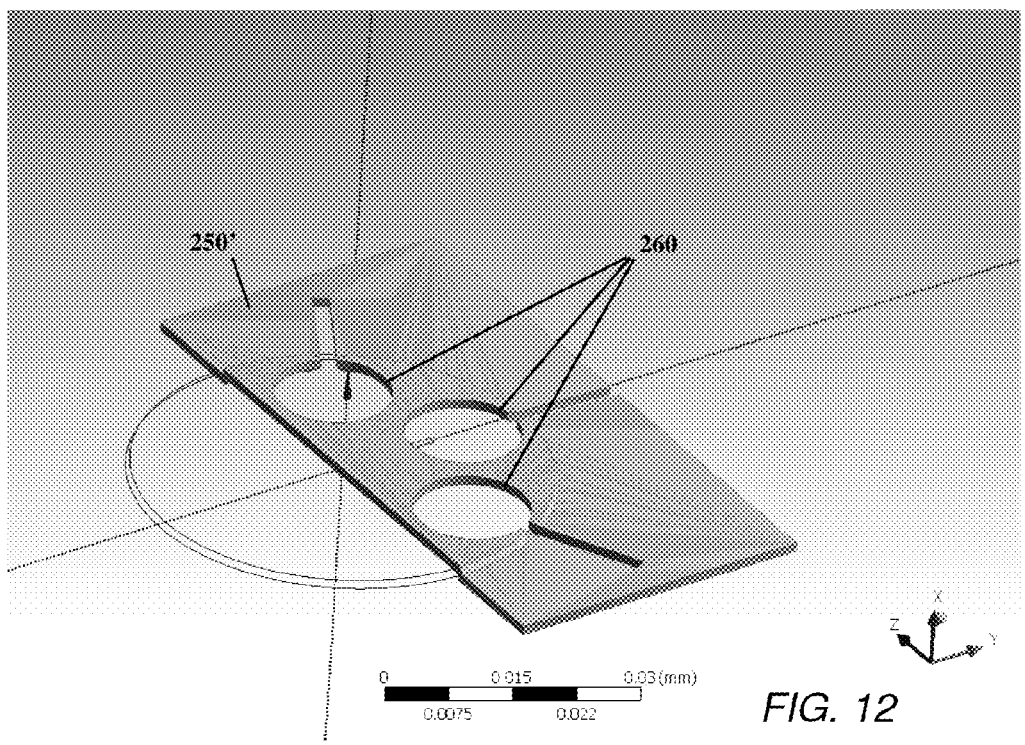
Figure 13:
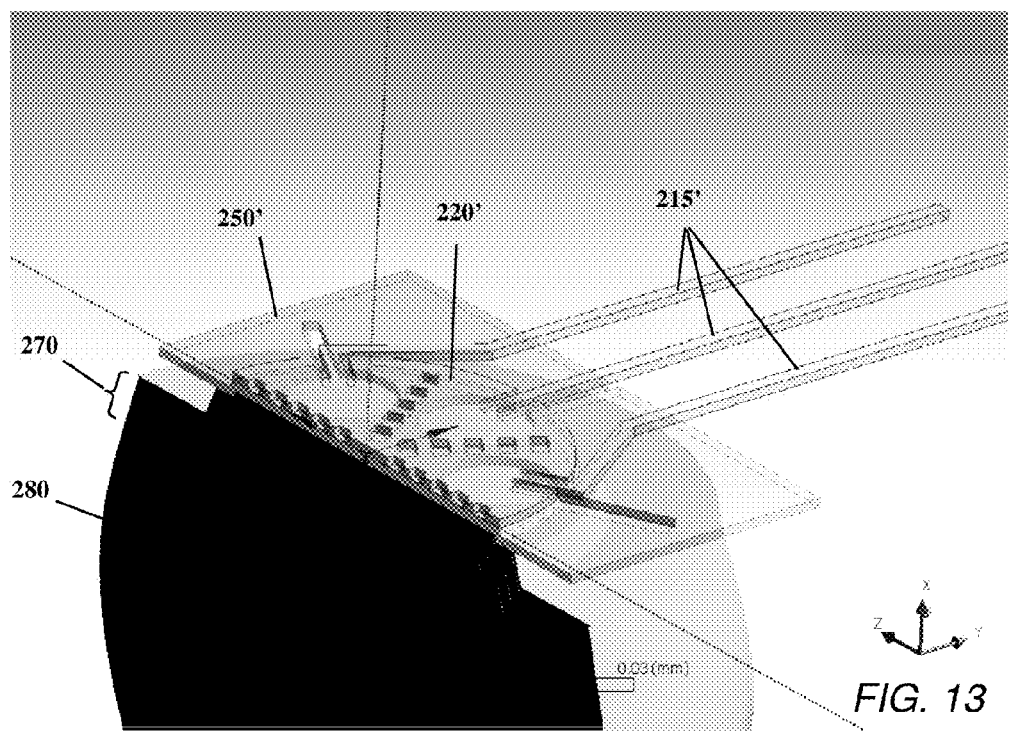

FIGS. 11-13 show perspective views of another embodiment of a contact pad 212', wires 215', and a conductive layer 250' in accordance with further aspects of the invention. For explanatory purposes, FIGS. 11-13 show only the conductive material and do not show insulating material (e.g., the LM layer, capping layer, passivation layer, etc.). Voids 260 in the conductive layer 250' represent where blocks (e.g., blocks 220) are arranged within the conductive layer 250'. As depicted in FIG. 13, a BLM layer 270 and solder bump 280 may be formed on the conductive layer 250', such that the contact pad 212', conductive layer 250', and BLM layer 270 form a conductive path between the wires 215' and the solder bump 280.

In accordance with aspects of the invention, the geometries of the contact pad and via(s) extending from the contact pad to the next conductive layer may be optimized to distribute the incoming current prior to the base of the final via. In accordance with additional aspects of the invention, the layer of aluminum (e.g., the aluminum pad) is eliminated from the TV and FV openings, and instead various combinations of copper pegs and plugs are arranged in the capping layer and the passivation layer. The copper pegs and plugs used in implementations of the invention distribute current better than an aluminum pad, and thus improve EM performance by reducing current crowding. Moreover, the use of copper pegs and plugs in embodiments of the invention, instead of a conventional aluminum pad, permits planarization of the top surface of the structure prior to UBM/BLM formation. Such planarization provides a smoother topology for the UBM/BLM and leads to improved yield and EM resistance. Additionally, elimination of the aluminum pad reduces process time and cost.

According to aspects of the invention described with respect to FIGS. 14-40, the full width of the BLM layer (UBM capture pad) may contact the highly conducting Cu metallization in the final via, which mitigates EM problems by providing a better distribution of current flow into the solder bump. Implementations of the invention provide a further advantage over conventional aluminum pads in that Cu metallization demonstrates improved EM resistance compared to Al. Moreover, in embodiments, the planarization (e.g., CMP) of the Cu plated in the final via allows a smoother topology for the BLM layer (UBM capture pad) formation leading to improved yield and EM resistance. Furthermore, in embodiments, the thick Cu (e.g., greater than about 5 µm) plated in the final via and embedded in the thick spin-on polymeric dielectric acts as a buffer to any detrimental stresses on the underlying layers of low-k dielectric. Even further, implementations of the invention provide solder bump contact arrangements that are formed using less processing steps.

Figure 14:
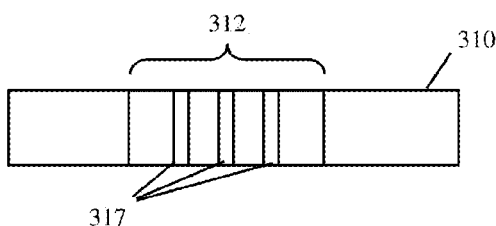
FIGS. 14-51 show semiconductor structures and respective processing steps of a solder bump contact arrangement in accordance with aspects of the invention.

FIGS. 14-22 show semiconductor structures and respective processing steps of a solder bump contact arrangement in accordance with aspects of the invention. More specifically, FIG. 14 shows a layer 310, which may be a last metal (LM) layer similar to layer 10 described with respect to FIG. 1. Included in the layer 310 is a contact pad 312 and one or more wires (not shown) that carry current to the contact pad 312. The contact pad 312 may have any suitable configuration, including a conventional geometry or a distributed configuration such as that described with respect to FIGS. 4-13 of this disclosure. The contact pad 312 may optionally include one or more posts 317, which may be similar to posts 17 described above with respect to FIG. 1. The contact pad 312 may be formed in the layer 310 using conventional processes (e.g. photolithographic patterning, etching, and metal fill) and materials (e.g., copper).

Figure 15:
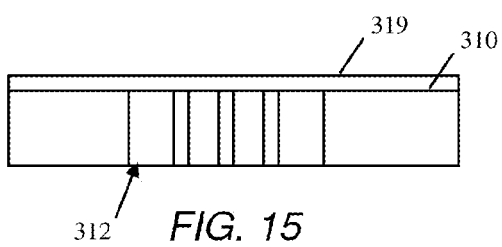

As shown in FIG. 15, a cap 319 is formed on the layer 310 and contact pad 312. In embodiments, the cap 319 is composed of silicon nitride or NBLoK (SiC(N,H)) deposited using conventional processes such as CVD, PECVD, ALD, etc. The cap 319 may have any desired thickness (e.g., depth). The invention is not limited to the exemplary materials and processes described herein, and other materials and/or processes may be used to form the cap 319 within the scope of the invention.

Figure 16:
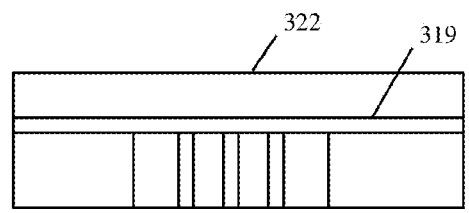

As depicted in FIG. 16, a lower capping layer 322 is deposited on the cap 319. In embodiments, the lower capping layer 322 is composed of $SiO_2$ and is deposited using conventional processes such as CVD, PECVD, etc. The lower capping layer 322 may have any desired thickness (e.g., depth). The invention is not limited to the exemplary materials and processes described herein, and other materials and/or processes may be used to form the lower capping layer 322 within the scope of the invention, such as atomic layer deposition (ALD) of other oxides.

Figure 17:
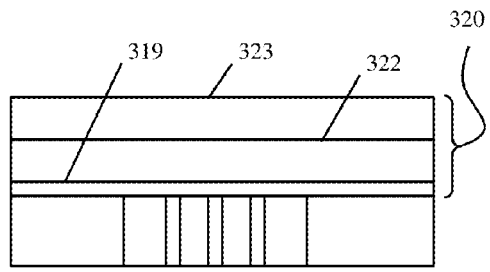

As depicted in FIG. 17, an upper capping layer 323 is deposited on the lower capping layer 322. In embodiments, the upper capping layer 323 is composed of SiN and is deposited using conventional processes such as CVD, PECVD, ALD, etc. The upper capping layer 323 may have any desired thickness (e.g., depth). The invention is not limited to the exemplary materials and processes described herein, and other materials and/or processes may be used to form the upper capping layer 323 within the scope of the invention, such as atomic layer deposition (ALD) of other nitrides.

In accordance with aspects of the invention, the cap 319, lower capping layer 322 and upper capping layer 323 constitute a capping layer 320. In embodiments, the capping layer 320 may be formed of any number (e.g., one or more) individual layers of hard dielectric material, and is not limited to the configuration shown in FIGS. 14-17.

Figure 18:
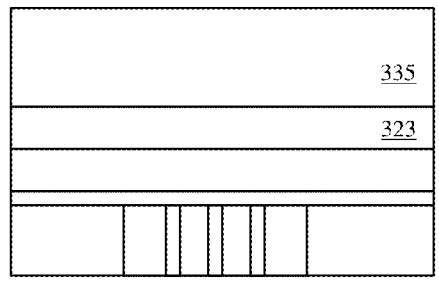

FIG. 18 shows a passivation layer 335 formed on the upper capping layer 323. In embodiments, the passivation layer 335 is composed of photosensitive polyimide (PSPI) and is deposited using conventional processes such as spin coating. The passivation layer 335 may be cured (e.g., baked) in order to complete the cross linking of the PSPI, as is known such that further explanation is not believed necessary for an understanding of the invention. The passivation layer 335 may have any desired thickness (e.g., depth). The invention is not limited to the exemplary materials and processes described herein, and other materials and/or processes may be used to form the passivation layer 335 within the scope of the invention, such as curtain coating of other polymer passivation materials.

Figure 19:
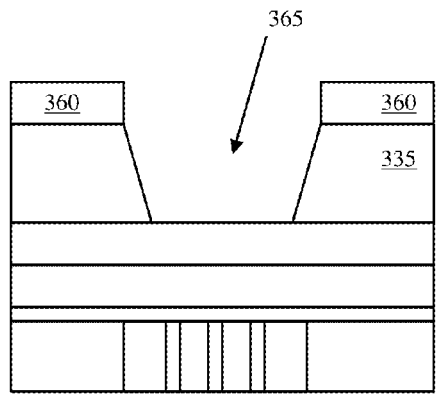

As depicted in FIG. 19, in embodiments, a mask 360 is applied to the top of the passivation layer 335. The mask 360 is used to form an opening 365 in the passivation layer 335. The mask 350 may be a photomask or hard mask that is created and patterned using conventional techniques. The opening 365 in the passivation layer 335 may be formed using any desired material removal process, including but not limited to wet etch, dry etch, etc.

Figure 20:
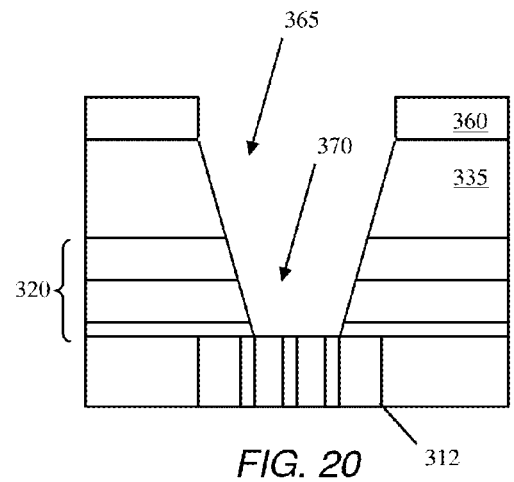

As depicted in FIG. 20, in embodiments, a second opening 370 is formed in the capping layer 320 (e.g., through upper capping layer 323, lower capping layer 322, and cap 319) using the mask 360 and/or the patterned passivation layer 335 as a mask. The second opening 370 may be formed using any desired material removal technique, such as a reactive ion etch (RIE) that is selective to the materials of the capping layer 320 but that does not etch the material of the contact pad 312. Moreover, although a two step process has been described for forming the opening 365 and the second opening 370, a single material removal process may be used to form the opening 365 and the second opening 370 in a single processing step. The mask 360 is removed using conventional stripping techniques before or after the formation of the second opening 370.

In embodiments, the opening 365 in the passivation layer 335 and the second opening 370 in the capping layer 320 are substantially aligned (e.g., coaxial) and expose an upper surface of the contact pad 312. In accordance with aspects of the invention, the opening 365 and second opening 370 may have any desired shape (e.g., in plan view), including, but not limited to substantially circular, oval, elliptical, square, rectangular, etc. Moreover, depending primarily on the material removal processes used, the sidewalls of the opening 365 and second opening 370 may be substantially vertical or may arranged at a non-zero angle relative to vertical.

Figure 21:
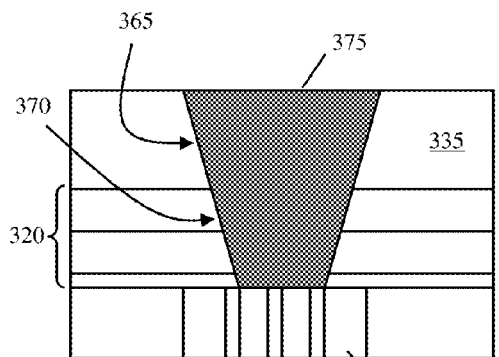

Referring to FIG. 21, a conductive pedestal 375 is formed in the opening 365 and second opening 370. In embodiments, the conductive pedestal 375 is formed by selectively depositing a copper liner (e.g., copper seed layer) on exposed surfaces of the opening 365 and second opening 370 (e.g., on portions of the passivation layer 335, capping layer 320, and contact pad 312), followed by copper plating and annealing. In accordance with aspects of the invention, the structure is planarized after formation of the conductive pedestal 375 using, for example, a chemical mechanical polish (CMP). In this manner, a smooth topography is provided for subsequent processing.

Figure 22:
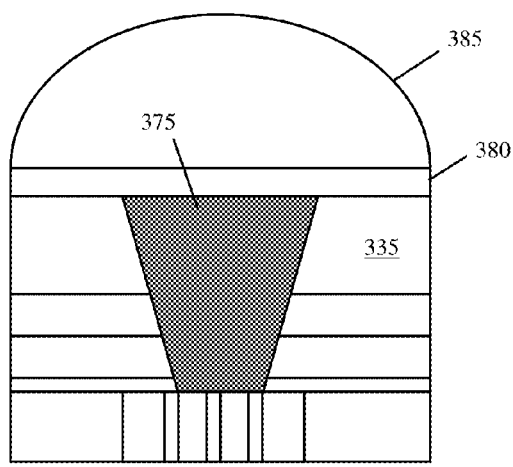

As shown in FIG. 22, a BLM layer 380 may be formed on the planarized top surface of the conductive pedestal 375 and the passivation layer 335, and a solder bump 385 is formed on the BLM layer 380. In embodiments, the BLM layer 380 may comprise one or more layers, including but not limited to a titanium-tungsten (TiW) layer directly on the conductive pedestal 375, a copper (Cu) layer on the TiW layer, and a nickel (Ni) layer on the Cu layer. However, the invention is not limited to such a BLM layer, and any suitable BLM layer may be used within the scope of the invention.

FIGS. 23-31 show semiconductor structures and respective processing steps of a solder bump contact arrangement in accordance with additional aspects of the invention. More specifically, the structure in FIG. 23 includes a layer 310 in which a contact pad 312 is formed, a cap 319, and a lower capping layer 322.

Figure 24:
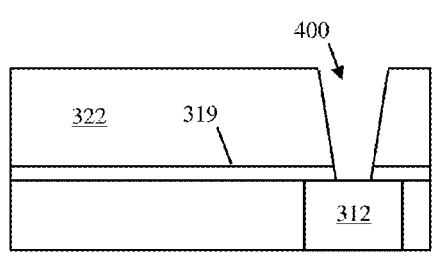

As shown in FIG. 24, a TV opening 400 is formed in the lower capping layer 322 and the cap 319 to expose a portion of the contact pad 312. The TV opening 400 may be formed using any conventional techniques, such as, for example, photolithographic masking and etching.

Figure 25:
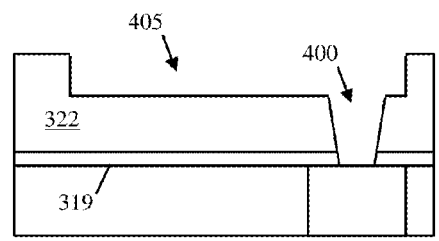
Figure 23:
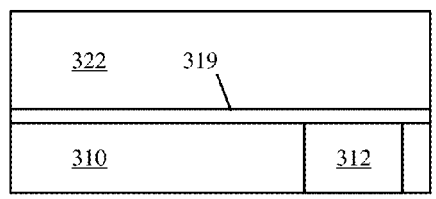

As depicted in FIG. 25, a trench 405 is formed in the lower capping layer 322. In embodiments, the trench 405 intersects the TV opening 400 and extends only partially through the cap 319. The trench 405 may be formed using any conventional techniques, including but not limited to, photolithographic masking and etching.

Figure 26:
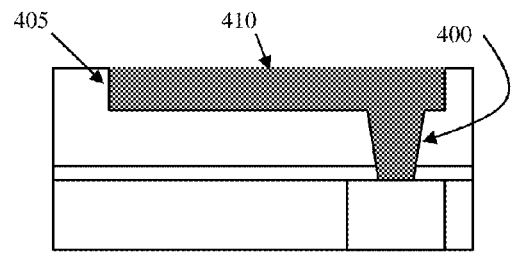

As depicted in FIG. 26, a conductor 410 is formed in the TV opening 400 and trench 405. In embodiments, the conductor 410 is formed by depositing a copper liner (e.g., copper seed layer) on exposed surfaces of the TV opening 400 and trench 405, followed by copper plating, and annealing. In accordance with aspects of the invention, the structure is planarized after formation of the conductor 410 using, for example, CMP.

Figure 27:
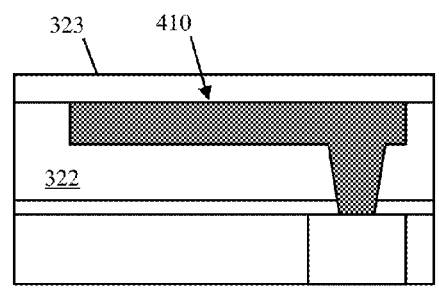

FIG. 27 shows the formation of an upper capping layer 323 on the upper surfaces of the conductor 410 and lower capping layer 322. The upper capping layer 323 may be formed in a manner similar to that described with respect to FIG. 17.

Figure 28:
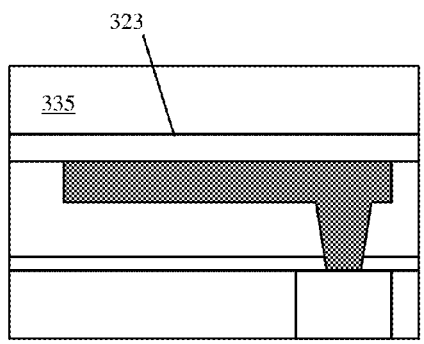

FIG. 28 shows the formation of a passivation layer 335 on the upper capping layer 323. The passivation layer 335 may be formed in a manner similar to that described with respect to FIG. 18.

Figure 29:
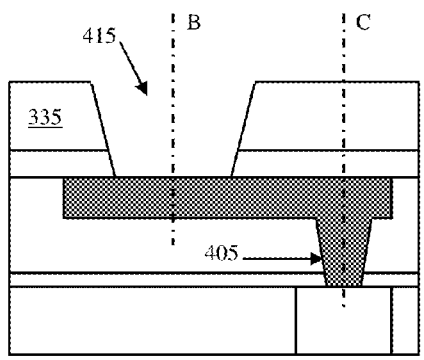

As shown in FIG. 29, an FV opening 415 is formed in the passivation layer 335 and upper capping layer 323. The FV opening 415 may be formed in a manner similar to the openings 365 and 370 described with respect to FIG. 19. In embodiments, the FV opening 415 is laterally offset from the TV opening 405, as depicted by the FV opening central axis "B" being spaced apart from the TV opening central axis "C".

Figure 30:
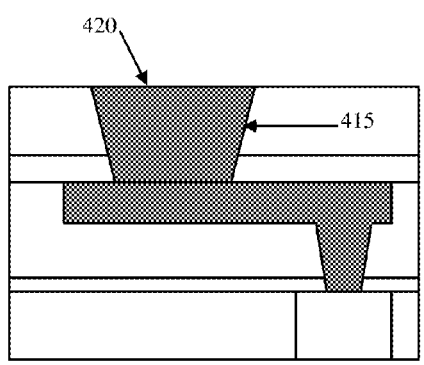

As depicted in FIG. 30, a final via 420 is formed in the FV opening 415. In embodiments, the final via 420 is formed by depositing a copper liner (e.g., copper seed layer) on exposed surfaces of the FV opening 415, followed by copper plating and annealing. In accordance with aspects of the invention, the structure is planarized after formation of the final via 420, using for example, CMP.

Figure 31:
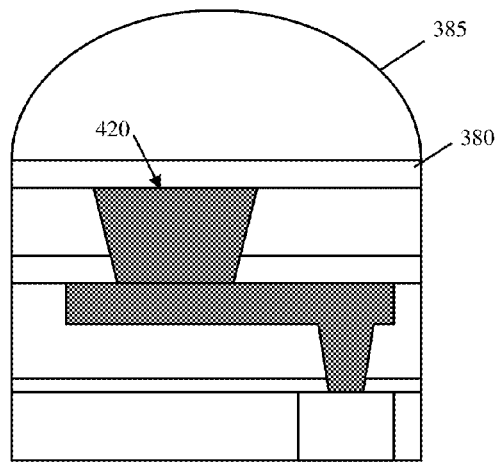
Figure 32:
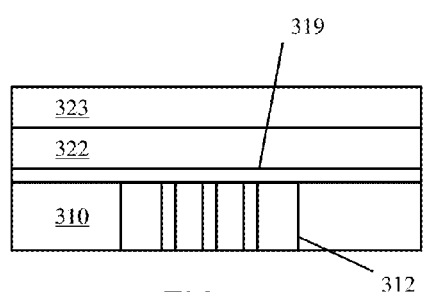

As shown in FIG. 31, a BLM layer 380 and solder bump 385 are formed on the structure. The BLM layer 380 is in contact with the final via 420. The BLM layer 380 and solder bump 385 may be formed in a manner similar to that described with respect to FIG. 22.

FIGS. 32-40 show semiconductor structures and respective processing steps of a solder bump contact arrangement in accordance with other aspects of the invention. More specifically, the structure in FIG. 32 includes a layer 310 in which a contact pad 312 is formed. A cap 319, a lower capping layer 322, and an upper capping layer 323 are formed over the contact pad 312.

Figure 33:
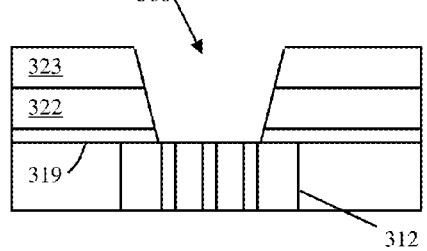

As depicted in FIG. 33, a TV opening 500 is formed in the cap 319, lower capping layer 322, and upper capping layer 323. The TV opening 500 exposes a portion of the contact pad 312. In embodiments, the TV opening 500 may be formed using conventional processing techniques, including but not limited to photolithographic masking (e.g., patterning, exposing, and developing) and etching (e.g., RIE).

Figure 34:
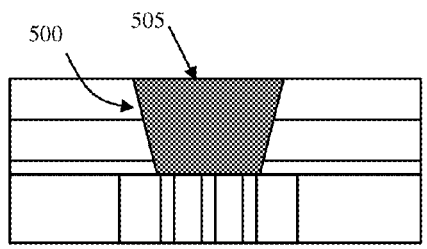

As depicted in FIG. 34, a terminal via 505 is formed in the TV opening 500. In embodiments, the terminal via 505 is formed by depositing a copper liner (e.g., copper seed layer) on exposed surfaces of the TV opening 500, followed by copper plating and annealing. In accordance with aspects of the invention, the structure is planarized after formation of the terminal via 505, using for example, CMP.

Figure 35:
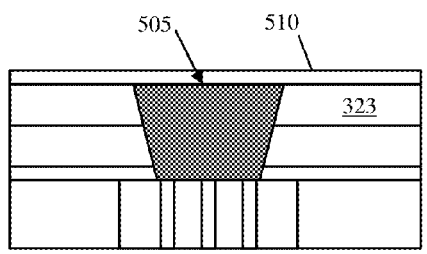

Referring to FIG. 35, a barrier film 510 may be formed on the planarized upper surfaces of the terminal via 505 and the upper capping layer 323. In embodiments, the barrier film 510 is composed of ultra-violet nitride (UVN) and is deposited using any suitable technique, such as CVD, PECVD, ALD, etc.

Figure 36:
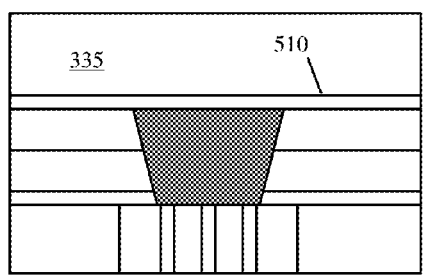

FIG. 36 shows the formation of a passivation layer 335 on the barrier film 510. The passivation layer 335 may be formed in a manner similar to that described with respect to FIG. 18.

Figure 37:
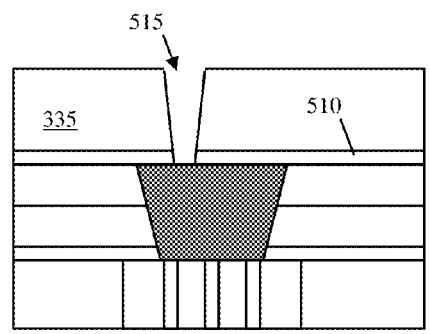
Figure 38:
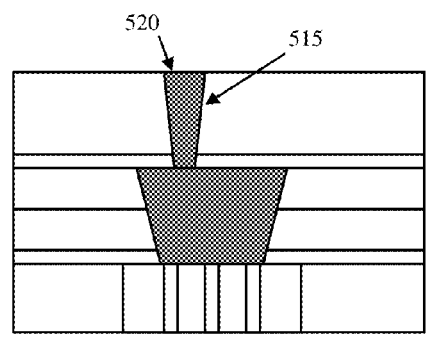

As shown in FIG. 37, an FV opening 515 is formed in the passivation layer 335 and barrier film 510. The FV opening 415 may be formed in a manner similar to the openings 365 and 370 described with respect to FIG. 19. As depicted in FIG. 38, a final via 520 is formed in the FV opening 515. In embodiments, the final via 520 is formed by depositing a copper liner (e.g., copper seed layer) on exposed surfaces of the FV opening 515, followed by copper plating and annealing. In accordance with aspects of the invention, the structure is planarized after formation of the final via 520, using for example, CMP.

Figure 39:
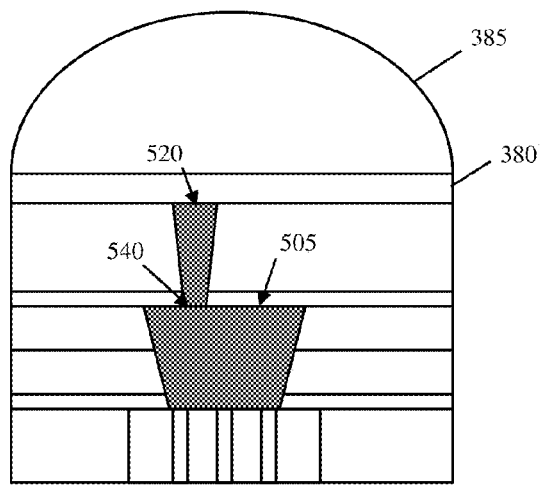

As shown in FIG. 39, a BLM layer 380 and solder bump 385 are formed on the structure. The BLM layer 380 is in contact with the final via 520. The BLM layer 380 and solder bump 385 may be formed in a manner similar to that described with respect to FIG. 22.

Figure 40:
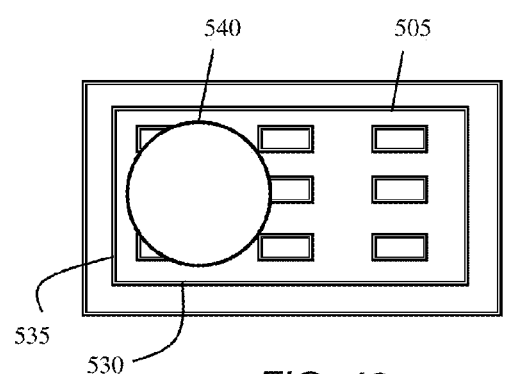
Figure 41:
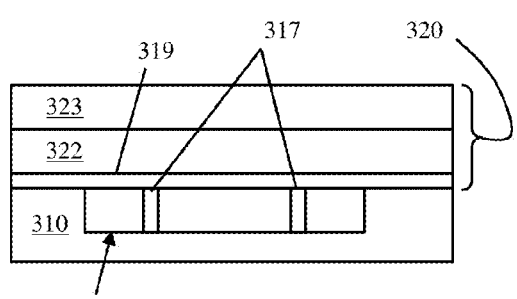

In accordance with aspects of the invention, at the interface between the final via 520 and the terminal via 505, the diameter of the final via 520 is smaller than a short edge of the terminal via 505. For example, as shown in FIG. 40, the terminal via 505 may have a substantially rectangular shape having a long edge 530 and a short edge 535. In embodiments, the lower portion 540 of the final via 520 is contained within the footprint of the terminal via 505. In a particular exemplary embodiment, the long edge 530 is about 36 to 40 µm, the short edge 535 is about 18 to 20 µm, and the diameter of the lower portion 540 of the final via 520 is less than about 18 µm. The diameter of the upper portion of the final via 520 is not constrained relative to the terminal via 505 and can be any desired value.

In accordance with further aspects of the invention, conductive structures in the capping layer and passivation layer are optimized for spreading current in a solder bump contact arrangement. FIGS. 41-51 show semiconductor structures and respective processing steps of a solder bump contact arrangement in accordance with additional aspects of the invention. More specifically, the structure in FIG. 41 includes a layer 310, a cap 319, a lower capping layer 322, and an upper capping layer 323. The cap 319, lower capping layer 322, and upper capping layer 323 collective form a hard dielectric capping layer 320. A contact pad 312 is disposed in the layer 310, and one or more posts 317 may be arranged within the contact pad 312.

Figure 42:
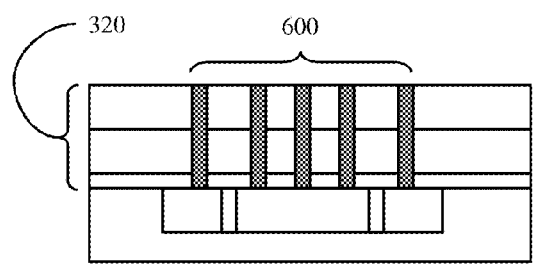

As depicted in FIG. 42, a plurality of terminal vias 600 are formed in the capping layer 320. In embodiments, the plurality of terminal vias 600 may be formed using conventional processes, including, but not limited to, masking and etching the capping layer 320 to form a plurality of terminal via openings, and depositing copper in the plurality of terminal via openings. The structure may be planarized, e.g., using CMP, after formation of the plurality of terminal vias.

Figure 43:
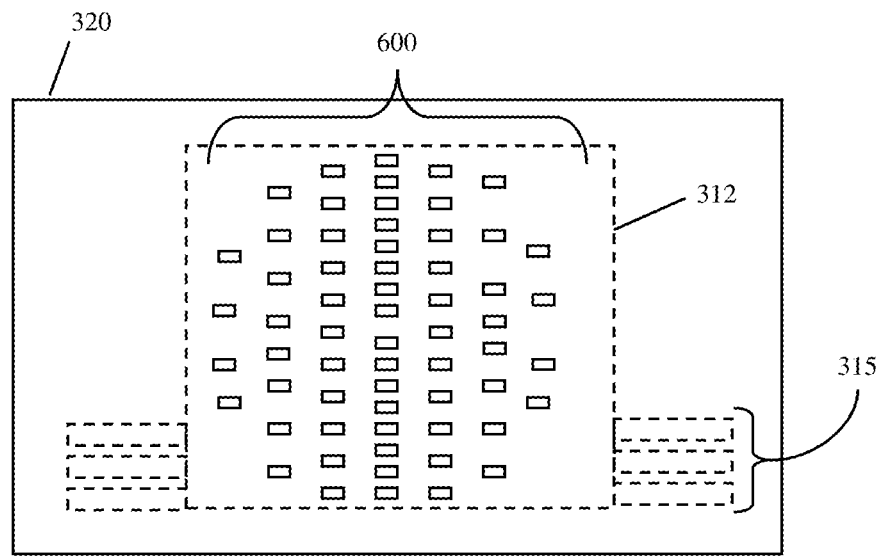
Figure 44:
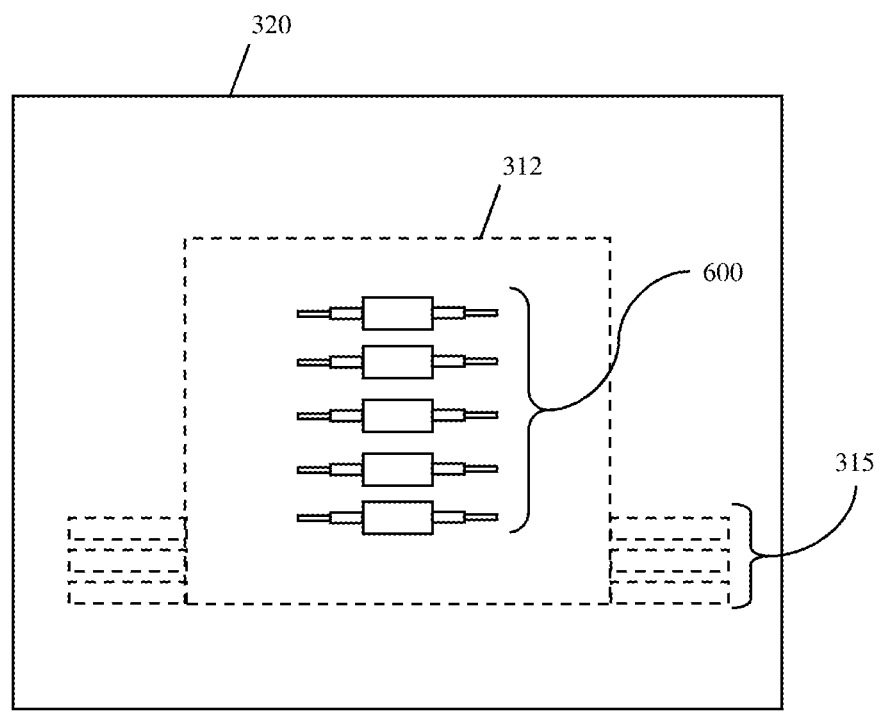

FIG. 43 shows an exemplary arrangement of the plurality of terminal vias 600 extending through the capping layer 320 down to the contact pad 312, with wires 315 shown connected to the contact pad 312. FIG. 44 shows another exemplary arrangement of the plurality of terminal vias 600' extending through the capping layer 320 down to the contact pad 312, with wires 315 shown connected to the contact pad 312. The invention is not limited to the exemplary arrangements shown herein, but rather, within the scope of the invention the plurality of vias may include any desired number of vias having any desired geometry.

Figure 45:
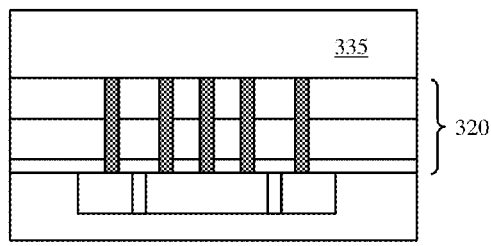
Figure 46:
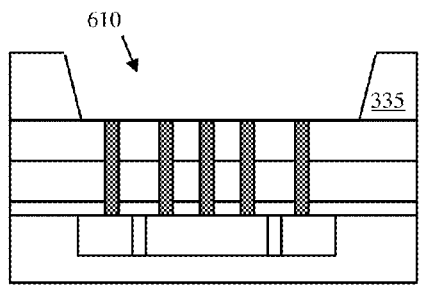

As depicted in FIG. 45, a passivation layer 335 is formed on the capping layer 320. The passivation layer 335 may be formed in a manner similar to that described with respect to FIG. 18. As depicted in FIG. 46, an FV opening 610 is formed in the passivation layer 335. The FV opening may be formed using conventional processes, such as those described with respect to FIG. 19.

Figure 47:
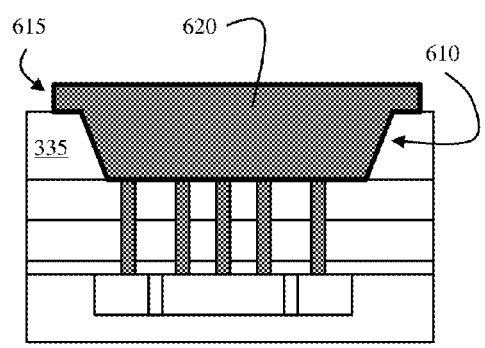

As depicted in FIG. 47, a BLM layer 615 and a copper pedestal 620 are formed in the FV opening 610 in the passivation layer 335. In embodiments, the copper pedestal 620 is formed using conventional electroplating process as is normally used for BLM/solder plating, such that further explanation is not believed necessary for complete understanding of the invention.

Figure 48:
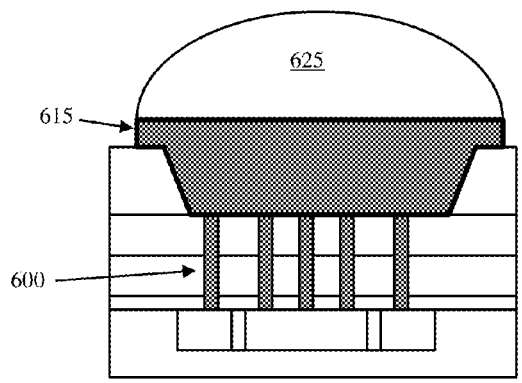

As shown in FIG. 48, a solder bump 625 is formed on the BLM layer 615. In accordance with aspects of the invention, the plurality of terminal vias 600 constitute a plurality of copper pegs that channel the current to different portions of the BLM layer 615 and solder bump 625.

Figure 49:
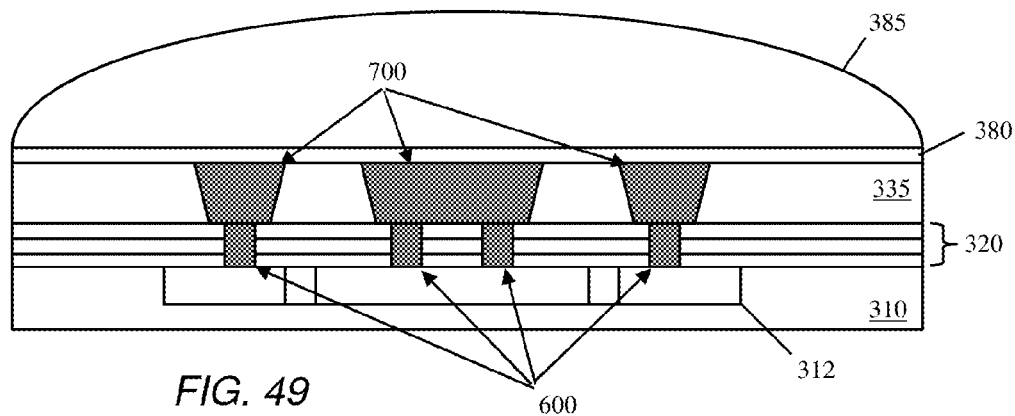

FIG. 49 shows a structure in accordance with aspects of the invention in which a plurality of terminal vias 600 are formed in the capping layer 320 above and in contact with a contact pad 312 formed in a last metal layer 310. In embodiments, the plurality of terminal vias 600 are formed using conventional processing techniques and are composed of copper. A CMP process is performed after forming the plurality of terminal vias 600 but prior to forming the passivation layer 335. In accordance with aspects of the invention, a plurality of final vias 700 are formed in the passivation layer 335 and in contact with the plurality of terminal vias 600. In embodiments, the plurality of final vias 700 are formed using conventional processing techniques and are composed of copper. A CMP process is performed after forming the plurality of final vias 700 but prior to forming the BLM layer 380 and the solder bump 385.

Figure 50:
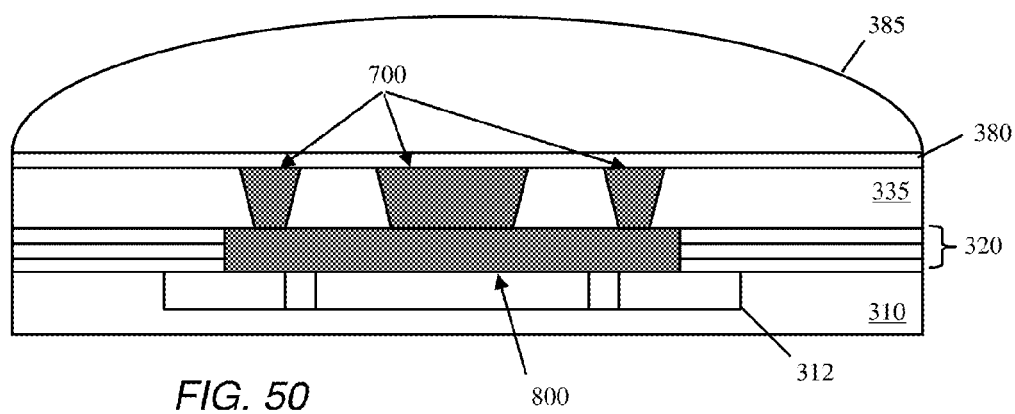

FIG. 50 shows a structure in accordance with additional aspects of the invention in which a plug via 800 is formed in the capping layer 320 above and in contact with a contact pad 312 formed in a last metal layer 310. In embodiments, the plug via 800 is formed using conventional processing techniques and is composed of copper. A CMP process is performed after forming the plug via 800 but prior to forming the passivation layer 335. In accordance with aspects of the invention, a plurality of final vias 700 are formed in the passivation layer 335 and in contact with the plug via 800. In embodiments, the plurality of final vias 700 are formed using conventional processing techniques and are composed of copper. A CMP process is performed after forming the plurality of final vias 700 but prior to forming the BLM layer 380 and the solder bump 385.

Figure 51:
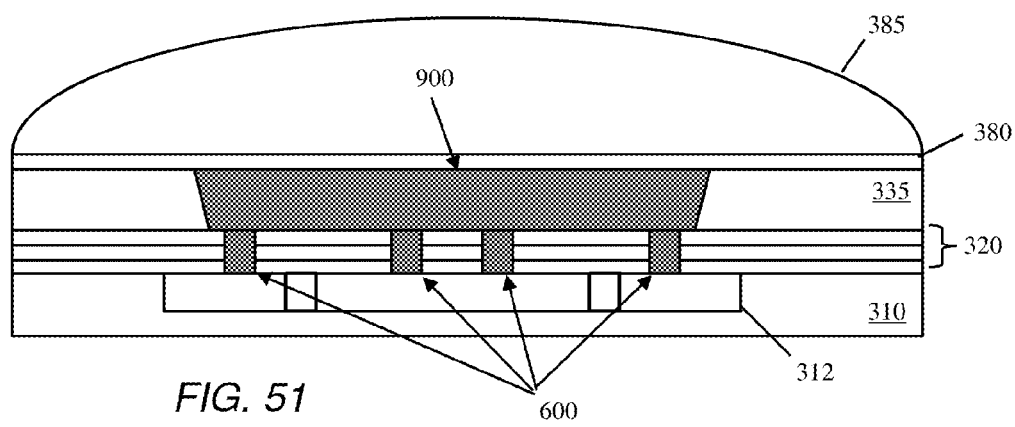

FIG. 51 shows a structure in accordance with aspects of the invention in which a plurality of terminal vias 600 are formed in the capping layer 320 above and in contact with a contact pad 312 formed in a last metal layer 310. In embodiments, the plurality of terminal vias 600 are formed using conventional processing techniques and are composed of copper. A CMP process is performed after forming the plurality of terminal vias 600 but prior to forming the passivation layer 335. In accordance with aspects of the invention, a single final via 900 is formed in the passivation layer 335 and in contact with the plurality of terminal vias 600. In embodiments, the single final via 900 is formed using conventional processing techniques and is composed of copper. A CMP process is performed after forming the single final via 900 but prior to forming the BLM layer 380 and the solder bump 385.

In accordance with further aspects of the invention, the current spreading structures described herein can be used in conjunction with the contact pad arrangements described herein. As but one example, the contact pad 312 used in the configuration shown in FIG. 49 may be similar to contact pad 100 described with respect to FIGS. 4 and 5 in that it is comprised of a plurality of same-resistance wires.

According to aspects of the invention, the structures shown in FIGS. 41-51 spread the current at the base of the BLM layer and/or C4 solder bump. Moreover, the structures are formed without a conventional aluminum pad. In this manner, implementations of the invention enhance EM resistance and enable optimal current input configuration at a base of a BLM layer and/or C4 solder bump. Additionally, aspects of the invention provide topographical planar surfaces (e.g., from CMP) within the plural layers of the structure. Such topographical planar surfaces are beneficial for current carrying capacity, and also are beneficial for eliminating conventionally used structures, such as aluminum pads.

Figure 52:
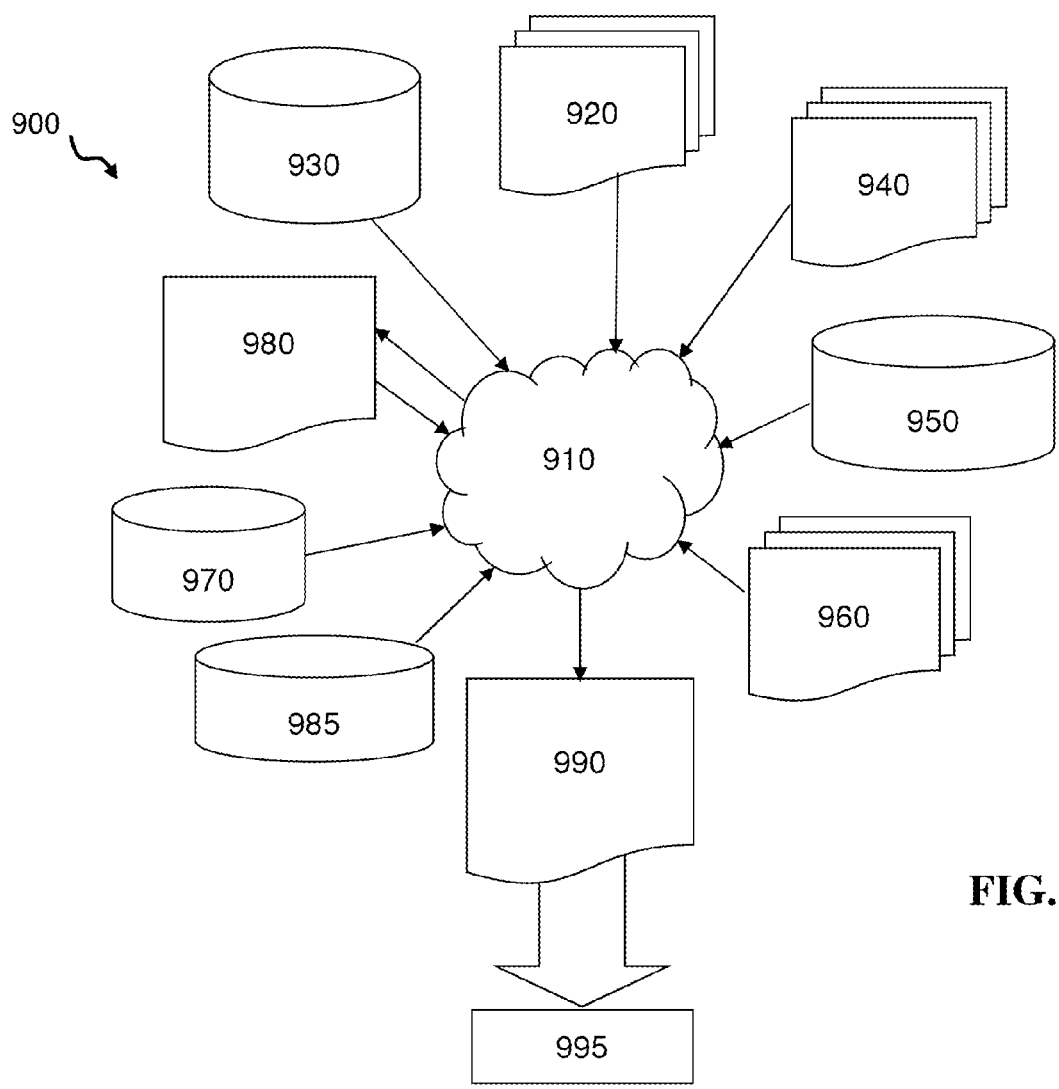
FIG. 52 is a flow diagram of a design process used in semiconductor design, manufacture, and/or test.

FIG. 52 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 4-51. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 52 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 4-51. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 4-51 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4-51. In one embodiment, design structure 990 may comprise a compiled, executable HDL simulation model that functionally simulates the devices shown in FIGS. 4-51.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 4-51. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A semiconductor structure, comprising:
   a contact pad in a last wiring level of a chip; and
   a plurality of wires of the contact pad extending from side edges of the contact pad to respective ones of a plurality of vias,
   wherein each one of the plurality of wires has substantially the same electrical resistances and
   at least two of the plurality of wires comprise different widths and different lengths.

2. The semiconductor structure of claim 1, wherein the plurality of wires are formed from the contact pad.

3. The semiconductor structure of claim 1, wherein at least one of the plurality of wires widens at a location adjacent a leading edge of a respective one of the plurality of vias.

4. A semiconductor structure, comprising:
   a contact pad in a last wiring level of a chip; and
   a plurality of wires of the contact pad extending from side edges of the contact pad to respective ones of a plurality of vias, wherein:
   each one of the plurality of wires has substantially the same electrical resistance,
   a first one of the plurality of wires has a first length and a first width,
   a second one of the plurality of wires has a second length and a second width,
   the first width is different from the second width, and
   the first length is different from the second length.

5. The semiconductor structure of claim 4, further comprising:
   a capping layer on the last wiring level of the chip;
   a passivation layer on the capping layer;
   at least one final via in the passivation layer;
   a ball limiting metallurgy (BLM) layer on the at least one final via and the passivation layer; and
   a solder bump on the BLM layer.

6. The semiconductor structure of claim 3, wherein:
   the plurality of vias are disposed in the capping layer;
   the plurality of vias and the capping layer have substantially coplanar upper surfaces; and
   the at least one final vias and the passivation layer have substantially coplanar upper surfaces.

7. A semiconductor device, comprising:

a solder bump contact pad in a last wiring level of a chip;

at least one wire in the last wiring level, wherein the at least one wire contacts the solder bump contact pad;

a dielectric capping layer formed on the last wiring level, the solder bump contact pad, and the at least one wire; and an opening in the dielectric capping layer, wherein the opening exposes a portion of an upper surface of the solder bump contact pad and defines at least one block, wherein the at least one block comprises residual material of the dielectric capping layer on a portion of the solder bump contact pad, and the at least one block surrounds a location where the at least one wire contacts the solder bump contact pad.

8. The semiconductor device of claim 7, further comprising a conductive layer formed in the opening and on the exposed portion of the solder bump contact pad.

9. The semiconductor device of claim 8, further comprising:

a ball limiting metallurgy (BLM) layer formed on the conductive layer; and a solder bump formed on the BLM layer, wherein the at least one block causes current entering the solder bump contact pad from the at least one wire to flow laterally within the solder bump contact pad beyond an area defined by the at least one block.

10. The semiconductor device of claim 7, wherein:

the at least one wire is formed as a plurality of wires; and the at least one block is formed as a plurality of blocks;

wherein respective ones of the plurality of blocks contact and cover respective locations of the solder bump contact pad where respective ones of the plurality of wires contact the solder bump contact pad.

11. A semiconductor device, comprising:

a capping layer formed on a solder bump contact pad that is arranged in a last wiring level of a chip;

a passivation layer formed on the capping layer;

a terminal via formed in the capping layer, wherein the terminal via contacts the solder bump contact pad;

a final via formed in the passivation layer, wherein the final via is in electrical contact with the terminal via;

a ball limiting metallurgy (BLM) layer formed on upper surfaces of the final via and the passivation layer; and a solder bump formed on the BLM layer, wherein the solder bump contact pad comprises a plurality of wires, which extend from side edges of the solder bump contact pad to respective ones of a plurality of vias, and each one of the plurality of wires has substantially the same electrical resistance.

12. The semiconductor device of claim 11, wherein the upper surfaces of the final via and the passivation layer are co-planar.

13. The semiconductor device of claim 11, wherein a central axis of the final via is laterally offset from a central axis of the terminal via.

* * * * *